United States Patent [19]

Eda et al.

[11] 4,318,042
[45] Mar. 2, 1982

[54] ELECTROMETER PROBE

[75] Inventors: Tadahiro Eda; Susumu Tatsumi; Chikara Imai, all of Tokyo, Japan

[73] Assignee: Ricoh Company, Ltd., Tokyo, Japan

[21] Appl. No.: 120,581

[22] Filed: Feb. 11, 1980

[30] Foreign Application Priority Data

Feb. 28, 1979 [JP] Japan .................................. 54-22689

[51] Int. Cl.$^3$ ............................................. G01R 31/02
[52] U.S. Cl. ................................ 324/72.5; 324/158 P; 324/457
[58] Field of Search ..................... 324/72.5, 457, 158 P

[56] References Cited

U.S. PATENT DOCUMENTS 4,065,717  12/1977  Kattner ............................... 324/72.5
4,161,692   7/1979  Tarzwell ............................ 324/72.5
4,233,562  11/1980  Blythe ................................. 324/457

OTHER PUBLICATIONS

K. Greene, "Flexible Electrical Probe and Method of Manufacture", IBM Tech. Disc. Bull., vol. 19, No. 12, May 1977, pp. 4686, 4687.

S. Frese, "Electrostatic Flex Probe", IBM Tech. Disc. Bull., vol. 6, No. 5, Oct. 1963, p. 39.

Primary Examiner—Michael J. Tokar
Attorney, Agent, or Firm—David G. Alexander

[57] ABSTRACT

A detecting electrode (22) is formed on a substrate (28), an amount of potential from a charged surface (23) induced in the detecting electrode (22) corresponding to a potential on the surface (23). A guard electrode (26) formed on the same surface of the substrate (28) as the detecting electrode (22) surrounds the detecting electrode (22). Part of the guard electrode (26b) is formed on the back surface of the substrate (28). The detecting electrode (22) is connected to a non-inverting input of an operational amplifier (24). The output of the operational amplifier (24) is connected to the inverting input thereof and also to the guard electrode (26) to produce unity gain and place the guard electrode (26) at the same potential as the detecting electrode (22). The substrate (28) is formed of a material such that the electrical resistance between the detecting electrode (22) and the guard electrode (26) is at least $10^9$ ohms to reduce zero drift to a negligible value.

17 Claims, 11 Drawing Figures

4,318,042

ELECTROMETER PROBE

BACKGROUND OF THE INVENTION

The present invention relates to an electrometer probe for measuring the electrostatic potential on a moving surface such as a photoconductive drum in an electrostatic copying machine. The measured potential may be used to control a developing bias voltage.

An electrode is disposed closely adjacent to the surface of the photoconductive drum to sense the potential of an electrostatic image thereon. A voltage is induced in the electrode which is proportional to the electrostatic image potential and is fed to a computing circuit which generates a developing bias voltage in accordance therewith. The bias voltage which is applied to a developing unit is slightly greater than the potential of the background areas of the electrostatic image and prevents the formation of a gray background in the finished copy. Preferably, more than one electrode is provided and the minimum output of the electrodes is selected since it corresponds to the background area potential.

This type of electrometer is known as the capacitance division type since capacitances exist between the drum surface and electrode and also between the electrode and ground. The induced voltage corresponds to the capacitance division ratio. The electrode is connected to an input of an amplifier.

It is important that the induced voltage in the electrode follow the potential on the surface without lag or drift. In addition, the electrode should not disrupt the electrostatic pattern on the surface.

The drift can be reduced to a low value as disclosed in U.S. Pat. No. 3,898,001 by surrounding all but a portion of the electrode which faces the surface with a conductive shield or guard. An improvement is disclosed in U.S. Pat. No. 3,729,675 in which a dielectric or electrically insulating material is provided between the detecting electrode and guard and the output of the amplifier is connected to the guard.

However, a problem which is not solved in these prior art disclosures is zero drift, which makes it necessary to set the zero point prior to each measurement. Zero drift is caused by current flow between the detecting electrode and guard due to a potential difference therebetween. This exists even if the amplifier is operated as a voltage follower with theoretically unity gain.

Assuming that the gain is 0.99999 and the input voltage is 300 V, a potential difference of 3 mV will exist between the electrode and guard. In addition, a potential difference caused by amplifier offset voltage can typically range from 0.5 mV to more than 5 mV. In order to minimize zero drift, the input resistance of the amplifier as viewed from the detecting electrode must be very large, the input capacitance must be very small and the input current must also be very small. However, an apparatus in which these conditions have been realized sufficiently to reduce zero drift to a negligible value has not been heretofore attained.

SUMMARY OF THE INVENTION

An electrometer probe embodying the present invention comprises a substrate, a detecting electrode provided on the substrate and a guard electrode provided on the substrate, the substrate being formed of a material such that an electrical resistance between the detecting electrode and the guard electrode is at least $10^9$ ohms.

A detecting electrode is formed on a substrate, an amount of potential from a charged surface induced in the detecting electrode corresponding to a potential on the surface. A guard electrode formed on the same surface of the substrate as the detecting electrode surrounds the detecting electrode. Part of the guard electrode is formed on the back surface of the substrate. The detecting electrode is connected to a non-inverting input of an operational amplifier. The output of the operational amplifier is connected to the inverting input thereof and also to the guard electrode to produce unity gain and place the guard electrode at the same potential as the detecting electrode. The substrate is formed of a material such that the electrical resistance between the detecting electrode and the guard electrode is at least $10^9$ ohms to reduce zero drift to a negligible value.

It is an object of the present invention to provide an electrometer probe which enables induced potential measurement without zero drift.

It is another object of the present invention to provide an electrometer apparatus which is more accurate than has been attainable in the prior art.

It is another object of the present invention to provide a generally improved electrometer probe.

Other objects, together with the foregoing, are attained in the embodiments described in the following description and illustrated in the accompanying drawing.

DESCRIPTION OF THE PREFERRED EMBODIMENTS

While the electrometer probe of the present invention is susceptible of numerous physical embodiments, depending upon the environment and requirements of use, substantial numbers of the herein shown and described embodiments have been made, tested and used, and all have performed in an eminently satisfactory manner.

Figure 1:
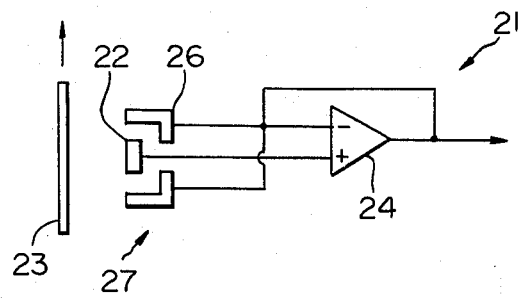
FIG. 1 is a schematic diagram of an electrometer apparatus embodying the present invention.

Referring now to FIG. 1 of the drawing, an electrometer apparatus embodying the present invention is generally designated by the reference numeral 21 and comprises an electrically conductive detecting electrode 22 made of metal or the like. Relative movement is effected between the electrode 22 and a surface 23 bearing an electrostatic potential. Typically, the surface 23 is that of a photoconductive drum in an electrostatic copying machine (not shown) which carries an electrostatic image of an original document. An electrical potential is induced in the electrode 22 which corresponds to the surface potential and the capacitance division ratio between the electrode 22 to surface 23 capacitance and the electrode 22 to ground capacitance.

The electrode 22 is connected to the non-inverting input of an operational amplifier 24. The output of the amplifier 24 is connected to the inverting input thereof and also to a guard or shield electrode 26. In this configuration, the amplifier 24 functions as a voltage follower (theoretical unity gain) and the output thereof, which is applied to the guard electrode 26, equal to the potential on the detecting electrode 22. The guard electrode 26 surrounds all but the part of the detecting electrode 22 which faces the surface 23 and greatly reduces the capacitance between the electrode 22 and ground. As a result, the major part of the potential on the surface 23 appears at the non-inverting input of the operation amplifier 24 and the linearity of the potential measurement is very high. The electrode 26 also shields the electrode 22 from external voltages which would introduce error into the measurement. The apparatus 21 therefore produces an accurate measurement of the potential on the surface 23. However, if the resistance between the electrodes 22 and 26 is low, voltage drift and zero drift will be produced as described above in the prior art.

Figure 2:
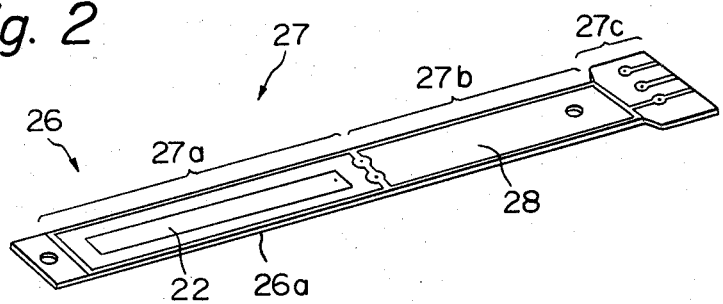
FIG. 2 is a perspective view of an electrometer probe embodying the present invention.
Figure 3:
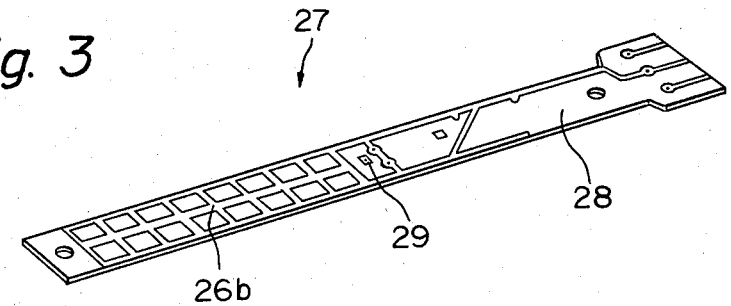
FIG. 3 is similar to FIG. 2 but shows the other side of the electrometer probe.

An electrometer probe 27 embodying the present invention is illustrated in FIGS. 2 and 3. FIG. 2 shows the front side of the probe 27 which faces the surface 23 whereas FIG. 3 shows the rear side of the probe 27. The probe 27 comprises a substrate 28 in the form of a flat strip made of glass fiber backed resin or other material which has very high electrical resistance. The detector electrode 22 is in the form of an electrically conductive strip which is deposited or otherwise formed on the substrate 28. The guard electrode 26 has a first section 26a formed on the front side of the substrate 28 surrounding the electrode 22 and a second section 26b formed on the rear side of the substrate 28 opposing the electrode 22. Preferably, the section 26b is in the form of a grid to reduce the capacitance between the electrode 22 and section 26b.

The probe 27 is divided into a detector section 27a in which the detector electrode 22 is provided, an amplifier section 27b for mounting the amplifier 24 and a connector section 27c for external connection of the probe 27 to the rest of the apparatus. A connector 29 extends through the substrate 28 from the electrode 22 to the rear surface of the substrate 28 for connection of the electrode 22 to the amplifier 24 which is mounted on the rear surface of the substrate 28 in the section 27b. The sections 26a and 26b of the guard electrode 26 are connected together either by means of a connector extending through the substrate 28 or externally by means of the connector section 27c.

The electrodes 22 and 26 may be formed on the substrate 28 by evaporation or deposition. Alternatively, both surfaces of the substrate 28 may be clad with copper or a similar conductive material and the electrode pattern formed by etching.

Figure 5:
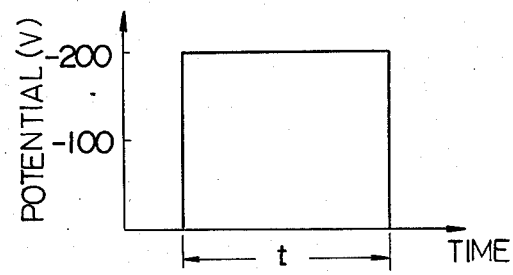
FIGS. 5 to 9 are graphs illustrating the performance of the present electrometer probe as the resistance between a detecting electrode and a guard electrode is increased.

FIGS. 5 to 9 illustrate the principles of the present invention. FIG. 5 illustrates the potential on the surface 23 as a function of time as sensed by the probe 27. Since the surface 23 is moved relative to the probe 27, the pattern of FIG. 5 corresponds to an area on the surface 23 having a potential of $-200$ V and a width equal to the speed of movement of the surface 23 multiplied by a time t. Thus, the potential sensed by the electrode 22 is $-200$ V during the time t and zero otherwise.

Figure 6:
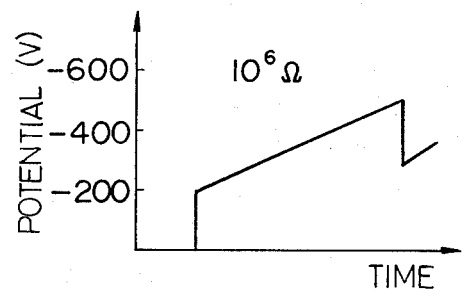

FIG. 6 illustrates a case in which the electrical resistance between the electrodes 22 and 26 is $10^6$ ohms. The graph illustrates both drift in the output voltage of the amplifier 24 and zero drift. This is caused by current flow through the substrate 28 due to non-unity gain and non-zero offset voltage. Detection in accordance with FIG. 6 is unacceptably for practical use.

Figure 7:
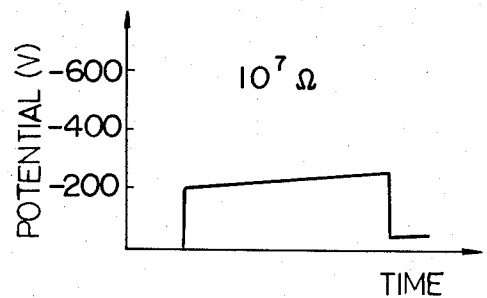
Figure 8:
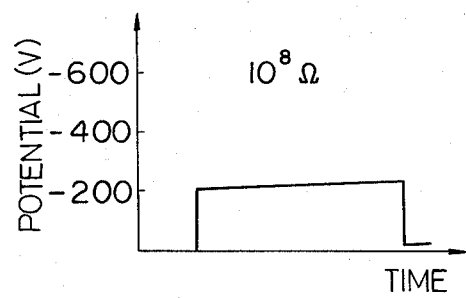
Figure 9:
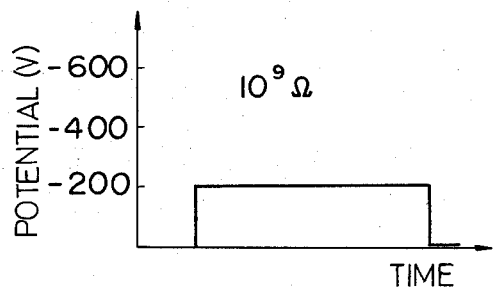
Figure 10:
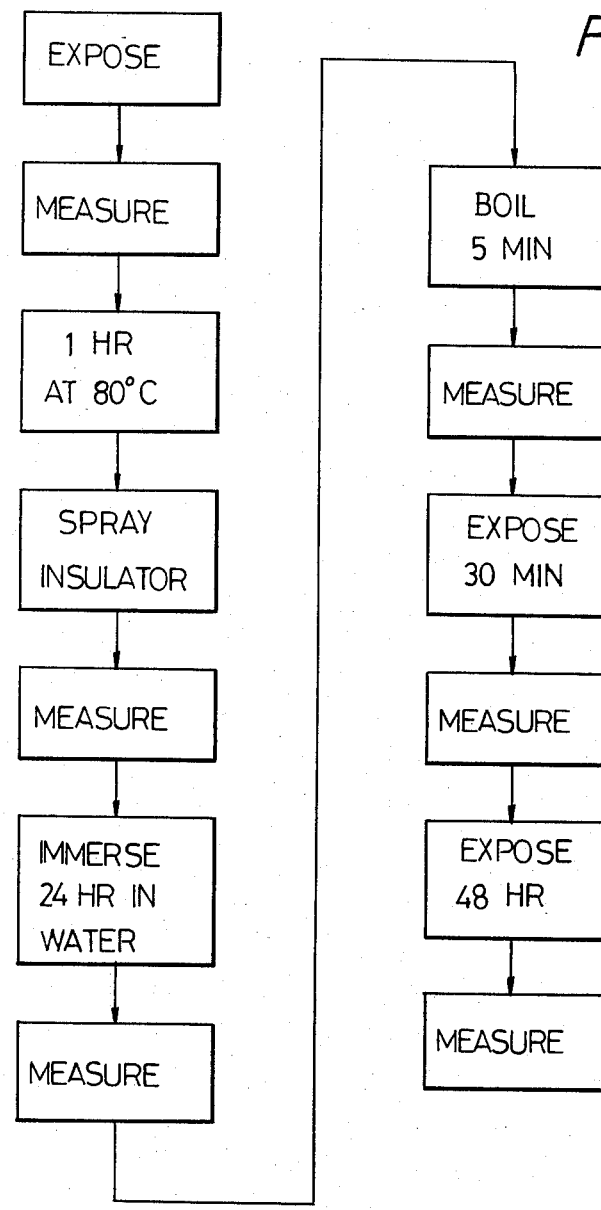
FIG. 10 is a flowchart illustrating a test procedure for the electrometer probe.
Figure 11:
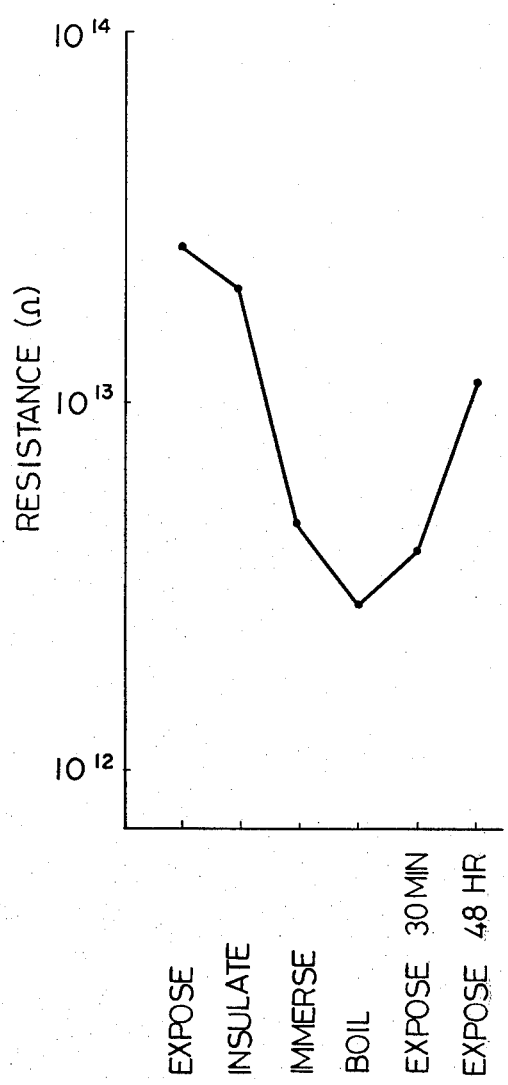
FIG. 11 is a graph illustrating the results of the test of FIG. 10.

In FIGS. 7 and 8 the insulation resistance between the electrodes 22 and 26 is increased to $10^7$ ohms and $10^8$ ohms respectively. At $10^8$ ohms the measurement accuracy is acceptable for practical use but the zero point must be adjusted periodically. At $10^9$ ohms both measurement accuracy and zero point drift are acceptable. However, the zero point may have to be adjusted at rather widely spaced intervals of time.

If the resistance is higher than $10^{11}$ ohms, measurement accuracy will be extremely high and the zero drift will be so negligible that it will never require adjustment. Thus, in an electrometer probe embodying the present invention, the material of the substrate 28 is selected so that the resistance between the electrodes 22 and 26 is at least $10^9$ ohms, and preferably at least $10^{11}$ ohms. In FIGS. 6 to 9 it is assumed that the direction of current flow through the substrate 28 is from the electrode 22 to the electrode 26. If current flow is in the opposite direction, the output of the amplifier 24 will decrease, rather than increase, with time.

An experimental electrometer probe 27 which was constructed and tested was 100 mm long and 12 mm wide and was disposed 2 mm from the potential bearing surface 23. A rather large amount of electrical energy was induced in the detecting electrode 22. This undesirable effect increases with the area of the detecting electrode 22. Where the detecting electrode 22 is made smaller to overcome this effect, the insulation resistance must be increased.

The zero point and output voltage may be stabilized by increasing the open loop gain of the amplifier 24. However, excessive increase results in the output voltage lagging the input voltage to an excessive extent. However, in accordance with the present invention, the desired results may be obtained by reducing the area of the detecting electrode 22 and increasing the open loop gain of the amplifier 24 by a moderate amount as long as the insulation resistance is at least $10^9$ ohms.

The electrometer probe 27 may be subjected to extreme conditions such as high humidity or operation in a dusty environment. In this case, the insulation resistance must be increased.

Various materials for the substrate 28 are commercially available. One combination is glass fiber and epoxy resin. Glass fiber may also be used in combination with a resin comprising a high molecular substance and a cyanate radical. The resin may be selected from the group consisting of triazine, BT resin, teflon, 4-ethylene fluoride, polyimido and xylok although any material providing the required insulation resistance may be employed.

Figure 4:
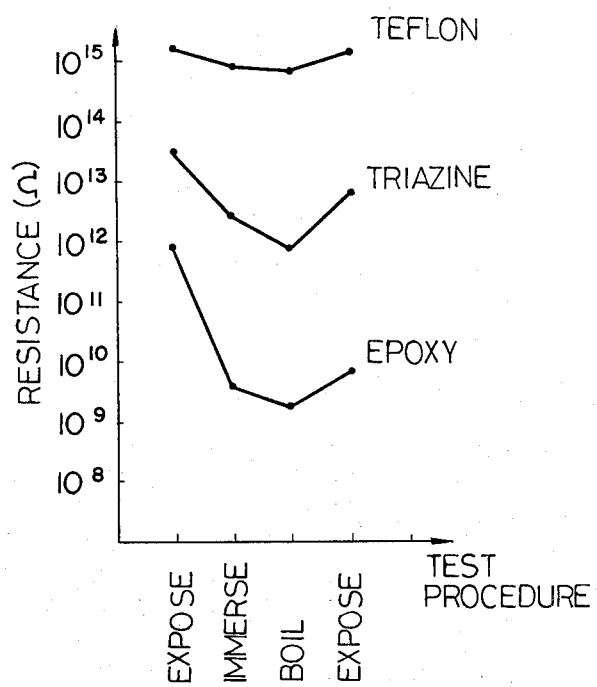
FIG. 4 is a graph illustrating the results of a test of the present probe.

FIG. 4 illustrates the results of a test performed on three probes 27 in which the substrate 28 comprised glass fiber. The glass fiber was formed in combination with teflon, triazine and epoxy resin in the three probes 27 respectively. The probes 27 were exposed to the atmosphere, immersed in water for 24 hours, boiled in water for 5 minutes and then exposed to the atmosphere for 48 hours, The insulation resistance between the electrodes 22 and 26 was measured after each test step. It will be seen that the resistance exceeded $10^9$ ohms in each case, with the maximum decrease in resistance being caused by boiling.

The probe 27 or at least the detecting electrode 22 may be coated with an electrically insulating layer to increase the resistance to humidity and foreign matter. A silicic material is ideal for this purpose and may be applied by spraying. FIG. 5 illustrates the test steps for a probe 27 comprising a substrate 28 formed of glass fiber and epoxy resin. Two layers of a silicic insulating material were sprayed on the entire probe 27. A voltage of 250 V was applied across the electrodes 22 and 26 after each test step and the current measured to determine the insulation resistance. The results of the test are shown in FIG. 6 and indicate that the silicic insulating coating maintains the insulation resistance above $10^{12}$ ohms, thereby achieving the desired results.

Preferably, the electrodes 22 and 26 are formed with surface patterns of projections and depressions to increase the surface area. When the probe 27 is rubbed with a cloth to clean it, some of the projections break off and are spread onto the substrate 28 between the electrode 22 and section 26a. This causes a drop in the resistance therebetween. This can be overcome by gold plating electrodes 22 and 26 to a thickness on the order of 0.2 to 03. microns immediately after forming the electrode 22. The gold spreads very thin and does not fill in the depressions of the surface pattern. Such application will prevent the projections from being broken off without decreasing the surface area. The insulating layer may be applied over the gold layer. The gold plating also protects the electrodes 22 and 26 since it is highly resistant to corrosives. If only the detecting electrode 22 is provided with the surface pattern of projections and depressions, it is only necessary to gold plate the electrode 22. Since it is a common procedure to gold plate the contacts in the connector section 27c, the electrodes 22 and 26 may be plated in the same process step. It is well within the scope of the present invention for the substrate 28 to be either rigid or flexible.

In summary, it will be seen that the present invention overcomes the drawbacks of the prior art and provides an electrometer probe which enables extremely accurate potential measurements without zero drift. Various modifications will become possible for those skilled in the art after receiving the teachings of the present disclosure without departing from the scope thereof.

What is claimed is:

1. An electrometer probe comprising a substrate, a detecting electrode provided on the substrate and a guard electrode provided on the substrate, the substrate being formed of a material such that an electrical resistance between the detecting electrode and the guard electrode is at least $10^9$ ohms;
said material comprising resin;
the resin comprising a reactive high molecular substance and a cyanate radical.

2. A probe as in claim 1, in which said material is selected such that said electrical resistance is at least $10^{11}$ ohms.

3. A probe as in claim 1, in which the guard electrode comprises a section provided on a same surface of the substrate as the detecting electrode which surrounds the detecting electrode.

4. A probe as in claim 1, in which the guard electrode comprises a section provided on an opposite surface of the substrate from the detecting electrode.

5. A probe as in claim 1, in which the detecting electrode is provided on a front surface of the substrate, the guard electrode comprising a section provided on the front surface of the substrate which surrounds the detecting electrode and a section provided on a rear surface of the substrate.

6. An electrometer probe comprising a substrate, a detecting electrode provided on the substrate and a guard electrode provided on the substrate, the substrate being formed of a material such that an electrical resistance between the detecting electrode and the guard electrode is at least $10^9$ ohms;
said material comprising resin;
the resin being selected from the group consisting of triazine, BT resin, teflon, 4-ethylene fluoride, polymido and xylok.

7. A probe as in claim 1, further comprising gold plating formed on the detecting electrode and the guard electrode.

8. A probe as in claim 1, further comprising an electrically insulating layer formed on the detecting electrode.

9. An electrometer probe comprising a substrate, a detecting electrode provided on the substrate and a guard electrode provided on the substrate, the substrate being formed of a material such that an electrical resistance between the detecting electrode and the guard electrode is at least $10^9$ ohms; and
an electrically insulating layer formed on the detecting electrode;
the insulating layer comprising a silicic material.

10. An electrometer probe comprising a substrate, a detecting electrode provided on the substrate and a guard electrode provided on the substrate, the substrate being formed of a material such that an electrical resistance between the detecting electrode and the guard electrode is at least $10^9$ ohms.
said material comprising resin;
said material further comprising fabric.

11. A probe as in claim 10, in which the fabric comprises glass.

12. A probe as in claim 10, in which the resin comprises epoxy.

13. A probe as in claim 12, in which the fabric comprises glass.

14. A probe as in claim 10, in which the resin comprises a reactive high polymer substance and a cyanate radical.

15. A probe as in claim 14, in which the fabric comprises glass.

16. A probe as in claim 10, in which the resin is selected from the group consisting of triazine, BT resin, teflon, 4-ethylene fluoride, polyimido and xylok.

17. A probe as in claim 16, in which the fabric comprises glass.

* * * * *